United States Patent
Niu et al.

(10) Patent No.: US 7,620,880 B2
(45) Date of Patent: *Nov. 17, 2009

(54) LDPC CONCATENATION RULES FOR IEEE 802.11N SYSTEM WITH PACKETS LENGTH SPECIFIED IN OFDM SYMBOLS

(75) Inventors: Huaning Niu, Santa Clara, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 486 days.

This patent is subject to a terminal disclaimer.

(21) Appl. No.: 11/313,402

(22) Filed: Dec. 20, 2005

(65) Prior Publication Data

US 2007/0143655 A1    Jun. 21, 2007

(51) Int. Cl.
*H03M 13/00* (2006.01)
(52) U.S. Cl. .............. 714/790; 714/752; 375/240.24
(58) Field of Classification Search .............. 714/752, 714/786, 790
See application file for complete search history.

(56) References Cited

U.S. PATENT DOCUMENTS

| | | | |
|---|---|---|---|
| 6,633,856 B2 | 10/2003 | Richardson et al. | |
| 6,718,508 B2 | 4/2004 | Lodge et al. | |
| 6,789,227 B2 | 9/2004 | De Souza et al. | |
| 6,847,678 B2 | 1/2005 | Berezdivin et al. | |
| 6,895,547 B2 | 5/2005 | Eleftheriou et al. | |
| 7,002,900 B2 | 2/2006 | Walton et al. | |
| 7,072,289 B1 | 7/2006 | Yang et al. | |

(Continued)

OTHER PUBLICATIONS

S.A. Mujtaba, "TGn Sync Proposal Technical Specification," doc.: IEEE 802.11, 11-04-0889r44, Mar. 2005, pp. 1-164.

(Continued)

*Primary Examiner*—Esaw T Abraham
(74) *Attorney, Agent, or Firm*—Kenneth L. Sherman, Esq.; Michael Zarrabian, Esq.; Myers Andras Sherman LLP

(57) ABSTRACT

A method of concatenation for LDPC encoding in an OFDM wireless system selects codewords based on the data packet payload size, wherein the payload size is the number of transmitted information bits in octets. For low transmission rates, shortening and puncturing across all codewords within the packet is applied to minimize OFDM symbol padding. For high transmission rates, only shortening across all codewords within the packet is applied to minimize OFDM symbol padding.

24 Claims, 10 Drawing Sheets

U.S. PATENT DOCUMENTS

| | | | |
|---|---|---|---|
| 7,173,978 | B2 | 2/2007 | Zhang et al. |
| 7,213,197 | B2 | 5/2007 | Jacobsen et al. |
| 7,260,055 | B2 | 8/2007 | Wang et al. |
| 7,283,499 | B2 | 10/2007 | Priotti et al. |
| 7,324,605 | B2 | 1/2008 | Maltsev et al. |
| 2002/0042899 | A1 | 4/2002 | Tzannes et al. |
| 2003/0014718 | A1 | 1/2003 | De Souza et al. |
| 2003/0126538 | A1 | 7/2003 | Mejean et al. |
| 2004/0034828 | A1 | 2/2004 | Hocevar |
| 2004/0098659 | A1 | 5/2004 | Bjerke et al. |
| 2004/0141548 | A1 | 7/2004 | Shattil |
| 2005/0034053 | A1 | 2/2005 | Jacobsen et al. |
| 2005/0091570 | A1 | 4/2005 | Eroz et al. |
| 2005/0283707 | A1* | 12/2005 | Sharon et al. ............... 714/758 |
| 2005/0283708 | A1 | 12/2005 | Kyung et al. |
| 2005/0283709 | A1 | 12/2005 | Kyung et al. |
| 2006/0036923 | A1 | 2/2006 | Hedberg et al. |
| 2006/0087961 | A1 | 4/2006 | Chang et al. |
| 2006/0123241 | A1 | 6/2006 | Martinian et al. |
| 2006/0123277 | A1* | 6/2006 | Hocevar ..................... 714/704 |
| 2006/0140294 | A1 | 6/2006 | Hottinen et al. |
| 2007/0022352 | A1 | 1/2007 | Eroz et al. |
| 2007/0041458 | A1 | 2/2007 | Hocevar et al. |
| 2007/0064828 | A1* | 3/2007 | Aldana et al. ............... 375/267 |
| 2007/0101229 | A1 | 5/2007 | Niu et al. |
| 2008/0256426 | A1 | 10/2008 | Reid et al. |

OTHER PUBLICATIONS

Kose, C.; and Edwards, B., "WWiSE Proposal: High throughput extension to the 802.11 Standard," a contribution to IEEE 802.11, 11-05-0149r2, Mar. 2005.

Van Veen, B.D.; and Buckley, K.M., "Beamforming: a versatile approach to spatial filtering", ASSP Magazine, IEEE, vol. 5, Iss. 2, Apr. 1988, pp. 4-24.

Barton, M., Unequal error protection for wireless ATM applications, 1996, IEEE, p. 1911-1915.

R.G. Gallager, "Low density parity check codes", IRE Trans. Inform. Theory, Jan. 1962, vol. IT-8, pp. 21-28.

T.J. Richardson, et al., "Design of capacity-approaching irregular low-density parity-check codes", IEEE Transactions on Information Theory, Feb. 2001, pp. 619-637, vol. 47, No. 2.

T. Zhang et al., "Joint (3, k)-regular LDPC code and decoder/encoder design", IEEE Transactions on Signal Processing, Apr. 2004, pp. 1065-1079, vol. 52, No. 4.

Yeo et al., "Iterative decoder architectures", IEEE Communications Magazine, IEEE, Aug. 2003, pp. 132-140, vol. 41, No. 8.

T.J. Richardson et al., "Efficient encoding of low-density parity-check codes", IEEE Transactions on Information Theory, Feb. 2001, pp. 638-656, vol. 47, No. 2.

Chung et al., "Analysis of sum-product decoding of low-density parity-check codes using a Gaussian approximation", IEEE Transactions on Information Theory, Feb 2001, pp. 657-670, vol. 47, No. 2.

Hu et al., "Progressive edge-growth Tanner graphs", IEEE Globecom 2001, pp. 995-1001.

Mackay et al., "Near Shannon limit performance of low density parity check codes," Electronics Letters, Mar. 13, 1997, p. 457-458, vol. 33, No. 6.

Mujtaba, S.A., "TGN Sync Proposal Technical Specification," doc.: IEEE 802.11- 041889r0, Aug. 2004, pp. 1-136.

Livshitz, M., et al., "TGnSync- Shortening Puncturing_Mar. 16," Nortel's PowerPoint presentation in LDPC subgroup a contribution for 802.11n, Mar. 16, 2005, pp. 1-14.

U.S. Office Action for U.S. Appl. No. 11/261,527 mailed on Jul. 10, 2008.

U.S. Office Action for U.S. Appl. No. 11/261,527 mailed on Mar. 16, 2009.

U.S. Office Action for U.S. Appl. No. 11/313,906 mailed on Mar. 2, 2009.

U.S. Office Action for U.S. Appl. No. 11/313,906 mailed on Aug. 18, 2008.

* cited by examiner

400

500

LDPC CONCATENATION RULES FOR IEEE 802.11N SYSTEM WITH PACKETS LENGTH SPECIFIED IN OFDM SYMBOLS

FIELD OF THE INVENTION

The present invention relates to wireless systems, and in particular, to Low Density Parity Check codes for wireless systems.

BACKGROUND OF THE INVENTION

Low Density Parity Check (LDPC) codes have recently attracted considerable attention owing to their capacity-approaching performance and low complexity iterative decoding. LDPC codes can be applied to a wide range of applications such as wireless communications, satellite communications and storage.

Currently, LDPC code is considered for in the high throughput wireless local area networks (WLAN), such as IEEE 802.11n, as an optional advanced code to improve system throughput. However, several issues need to be solved to match the LDPC code with unique system characteristics of different WLAN systems. First is the code size. Since LDPC code works better with longer code size, the code size should be selected as large as possible to ensure performance. However, since a WLAN system is a random access based system, the code size is limited by the SIFS (Short Inter-Frame Space) decoding budget. Therefore, the largest code size is limited to around 2K bits. Second, in high-throughput WLAN systems, the transmitted PPDU (Physical Protocol Data Unit) is large, which requires using several LDPC codewords. A method for concatenating the LDPC codeword within a PPDU is an important design issue. Since transported data packets can be any size from typically about 40 bytes up to 12000 bytes and larger, the WLAN system must be able to encode packets with variable lengths in a consistent manner. This consistency is required to ensure that the receiver always knows how to reconstruct the information data from the encoded transmitted data.

In a typical LDPC coded 802.11n WLAN system, the scrambled information bits are first zero padded to integer number of LDPC codeword, then coded with a systematic LDPC code. The coded codewords are parsed into different streams using either a bit parser or a group parser. The number of LDPC codewords within one packet is decided by the packet length and the concatenation rules.

Recently, the TGn Sync multi-industry group modified the HTLENGTH definition (indicating the length of the packet) in HT-SIG field in order to free additional signaling bits in the HT-SIG field of the PPDU (described in S. A. Mujtaba, "TGn Sync Proposal Technical Specification," a contribution to IEEE 802.11, 11-04/0889r4, March 2005, incorporated herein by reference). This requires the corresponding change in the LDPC concatenation rule. The prior art LDPC concatenation rules deal with the long HTLENGTH which presents the packet length on octets. Due to the change of HTLENGTH, there is a need to design the corresponding efficient LDPC concatenation rules.

BRIEF SUMMARY OF THE INVENTION

A method of concatenation for LDPC encoding in an orthogonal frequency division multiplexing (OFDM) wireless system selects codewords based on the data packet payload size, wherein the payload size is the number of transmitted information bits in octets. For low transmission rates, shortening and puncturing across all codewords within the packet is applied to minimize OFDM symbol padding. For high transmission rates, only shortening across all codewords within the packet is applied to minimize OFDM symbol padding.

These and other features, aspects and advantages of the present invention will become understood with reference to the following description, appended claims and accompanying figures.

BRIEF DESCRIPTION OF THE DRAWINGS

In the drawings, like numbers refer to like elements.

DETAILED DESCRIPTION OF THE INVENTION

Figure 1:
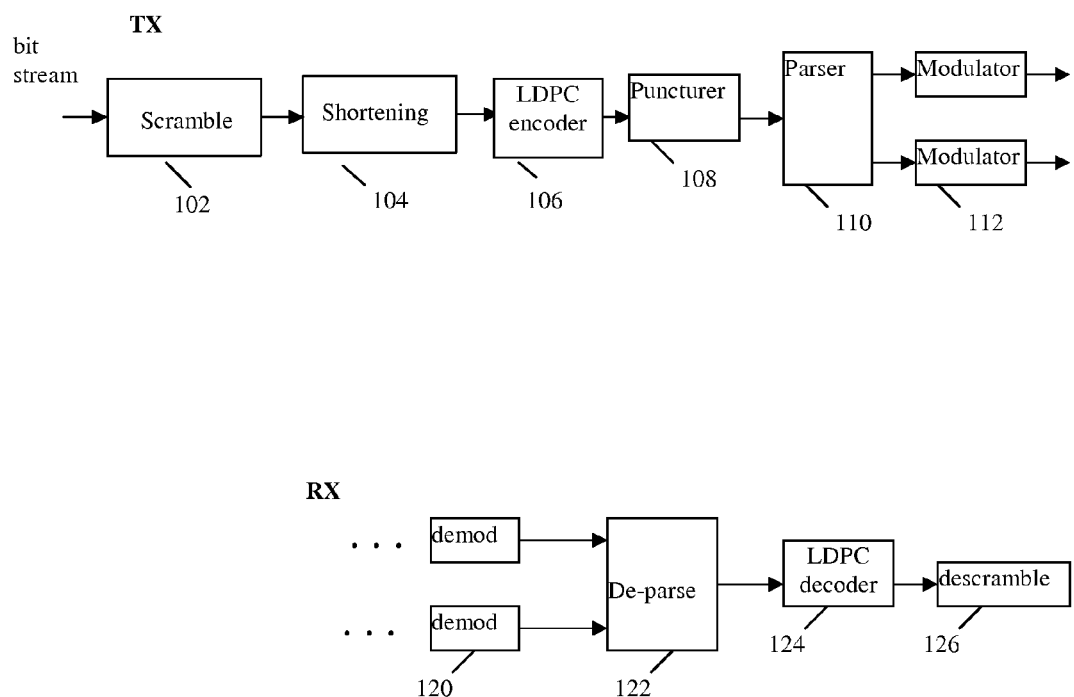
FIG. 1 shows a block diagram of an embodiment of an OFDM wireless transmission system which implements an embodiment of the present invention.

The present invention provides an improved LDPC encoding for MIMO wireless WLAN systems. A method of concatenation for LDPC encoding in an OFDM wireless system according to the present invention selects codewords based on the data packet payload size and transmission rate, wherein the payload size is the number of transmitted information bits in OFDM symbols. For low transmission rates, shortening and puncturing across all codewords within the packet is applied to minimize OFDM symbol padding. For high transmission rates, only shortening across all codewords within the packet is applied to minimize OFDM symbol padding.

To help in understanding the present invention, relevant details of the aforementioned TGn Sync modification in HTLENGTH definition and a current LDPC concatenation rule are first described.

Modified HTLENGTH

For the modified HTLENGTH description, the existing 1-bit AGGREGATE and 18-bit HTLENGTH fields in the HT SIGNAL field are replaced by a single 12-bit HTLENGTH field, as:

| HTLENGTH (12 bits) | | | | | | | | | | | |
|---|---|---|---|---|---|---|---|---|---|---|---|
| H0 | H1 | H2 | H3 | H4 | H5 | H6 | H7 | H8 | H9 | H10 | H11 |

The HTLENGTH Field is Interpreted According to Table 1 below:

TABLE 1

HTLENGTH field interpretation

| HTLENGTH bH11H10_H9H8H7H6H5H4H3H2H1H0 | Aggregate | Length |
|---|---|---|
| b00_H9H8H7H6H5H4H3H2H1H0 | N | b00_H9H8H7H6H5H4H3H2H1H0 octets |
| b01_H9H8H7H6H5H4H3H2H1H0 | N | b01_H9H8H7H6H5H4H3H2H1H0 octets |
| b10_H9H8H7H6H5H4H3H2H1H0 | N | b10_H9H8H7H6H5H4H3H2H1H0 octets |
| b11_H9H8H7H6H5H4H3H2H1H0 | Y | bH9H8H7H6H5H4H3H2H1H0 OFDM symbols |

In the non-aggregate mode, if the two MSBs of the 12-bit HT-Length field bH11H10 are b00, b01 or b10, then all 12 bits of the HTLENGTH field shall specify the number of octets in the PSDU. PSDUs with more than 3071 octets shall be transmitted in Aggregate Mode.

In the aggregate mode, if the two MSBs of the 12-bit HT-Length field bH11H10 are b11, then the 10 LSBs of the HTLENGTH field bH9H8H7H6H5H4H3H2H1H0 shall specify the number of OFDM symbols. For convolutionally encoded packets, pad-bits with value b0 shall be inserted before the tail bits such that the tail bits always appear as the last 6 bits in the last OFDM symbol. The RX PHY shall pass the PSDU and any pad bits to the RX MAC.

LDPC Concatenation Rule

The current LDPC concatenation rule with aggregation is defined by the pseudo-code (algorithm) in Table 2 below for the transmitter side.

TABLE 2

Transmitter side LDPC concatenation rule

Input: Number of coded bits per OFDM symbol:
$N_{CBPS} = N_{BPSC}* N_{SD}*N_{SS}$
Number of information bits per OFDM symbol:
$N_{DBPS} = N_{CBPS}* R$
Number of transmitted information bits in octets: TXVECTOR-HT-LENGTH
where $N_{BPSC}$ is the number of coded bits per sub-carrier, $N_{SD}$ is the number of data sub-carriers, and $N_{SS}$ is the number of spatial streams.
Output: Number of transmitted OFDM symbols: $N_{OFDM}$ = HTLENGTH (bits 0 through 9) Encoded codewords
Pseudo-code:
  (1)    Calculate the number of OFDM symbols to be transmitted as
      HTLENGTH = $N_{OFDM}$ = ceil(TXVECTOR-HT-LENGTH / $N_{DBPS}$)+1
  (2)    Calculate the equivalent information bits (actually information bits plus the zero padding bits) as
      $N_{INFO\_BITS} = (N_{OFDM}-1)*N_{DBPS}$.
  (3)    Calculate the shortening and puncturing bits (Nshortening and Npuncturing) per codeword based on $N_{INFO\_BITS}$ and $N_{OFDM}$.
  (4)    Pad ($N_{INFO\_BITS}$ − TXVECTOR-HT-LENGTH*8) zeros to the information bits. Crop the padded information bits equally to the number of LDPC codewords. Padding extra Nshortening zero to each information segment and encode. Encoded codeword. Puncture the coded codeword with Npuncturing bits. Send the punctured codeword to parser.

The current LDPC concatenation rule with aggregation is defined by the pseudo-code in Table 3 below for the receiver side.

TABLE 3

Receiver side LDPC concatenation rule

Input: Number of coded bits per OFDM symbol: $N_{CBPS} = N_{BPSC}* N_{SD}*N_{SS}$
Number of information bits per OFDM symbol: $N_{DBPS} = N_{CBPS}* R$
Number of transmitted OFDM symbols in octets: $N_{OFDM}$=HTLENGTH
Output: $N_{OFDM}$ * DBPS information bits
Pseudo-code:
  (1)  Calculate the number of equivalent output information bits as
      $N_{INFO\_BITS}$ = (HTLENGTH−1) * $N_{DBPS}$
  (2) Calculate the number of LDPC codewords and Nshortening and Npuncturing
  (3) Decode the codewords using Nshortening and Npuncturing and get the equivalent information bits Improved Concatenation Rule and Code Size The present invention provides an improved concatenation rule and code size. The LDPC block size is an integer number of OFDM tones. For example, with the current TGnSync 20 MHz specification ((S. A. Mujtaba, "TGn Sync Proposal Technical Specification," a contribution to IEEE 802.11, 11-04/0889r4, March 2005), with 52 data tones per OFDM symbol)), the code size is selected to be 1872 and 1248. Other code sizes according to the present invention are possible.

FIG. 1 shows a system architecture for an LDPC coded 802.11n system 100 which includes LDPC encoding with a concatenation rule according to an embodiment of the present invention. The system 100 includes a transmitter TX and a receiver RX. The transmitter TX includes a scrambler 102, shortening unit 104, an LDPC encoder 106, a puncturer 108, a parser 110 and multiple modulators 112. The receiver RX includes multiple demodulators 120, a de-parser 122, an LDPC decoder 124 and a descrambler 126.

In the transmitter TX, user information bits are passed through a scrambler 102 which randomizes the information bits, then the shortening unit 104, and are then encoded using a short to moderate block length Low Density Parity Check (LDPC) code in the LDPC Encoder 106. The encoded bits then punctured in puncturer 108 and then passed through the round robin spatial parser 110 and then a constellation modulator 112 to form transmitted constellation point for each transmission path. The rest of the TX transmission chain follow the same as the convolutional codes and omitted here.

In the receiver side RX, the first part of the receiver chain is also the same as the convolutional codes, therefore omitted. The demodulators 120 demodulate the detected symbols to soft bit information. The De-parser 122 deparses the demodulated information, and input the soft bit metrics to LDPC decoder 124, and the LDPC decoder 124 performs LDPC decoding. The descrambler 126 then descrambles the decoded information bits, which generates the same sequence as the source input.

The concatenation rule for LDPC encoding in the system 100 of FIG. 1 according to the present invention is an extension of the current TGnSync specification (S. A. Mujtaba, "TGn Sync Proposal Technical Specification," a contribution to IEEE 802.11, 11-04/0889r4, March 2005, incorporated herein by reference). According to an embodiment of the present invention, without aggregation at low data rate transmission, shortening and puncturing are applied to minimize the extra OFDM symbol padding, whereas for higher data rate transmission only shortening is applied. In the aforementioned TGnSync specification with 52 data tones, when $N_{dbps}$ is less than 234, which is corresponding to 58.5 Mbps transmission rate, it is considered as low transmission rate. Further, in said TGnSync specification with 52 data tones, when $N_{dbps}$ is greater than 234, which is corresponding to 58.5 Mbps transmission rate, it is considered as high transmission rate.

Codewords are selected based on the data packet payload size, wherein the payload size is the number of transmitted information bits in OFDM symbols. The LDPC block size is selected as an integer number of OFDM tones.

With aggregation, shortening and puncturing are applied for lower data rates, whereas for higher data rates only shortening is applied because of simplicity and efficiency. The process of applying shortening and puncturing for low data rate is similar as current LDPC concatenation rule as described in the prior art. An example process of transmitter side (TX) concatenation rule with aggregation for high data rate transmission according to the present invention is described below. The process input and output values include:

Input:
  Number of coded bits per OFDM symbol: $N_{CBPS}=N_{BPSC}*N_{SD}*N_{ss}$,
  Number of information bits per OFDM symbol: $N_{DBPS}=N_{CBPS}*R$,
  Number of transmitted information bits in octets: TXVECTOR-HT-LENGTH.

Output:
  Number of transmitted OFDM symbols: $N_{OFDM}$=HTLENGTH (bits 0 through 9) Encoded codewords.

Figure 2:
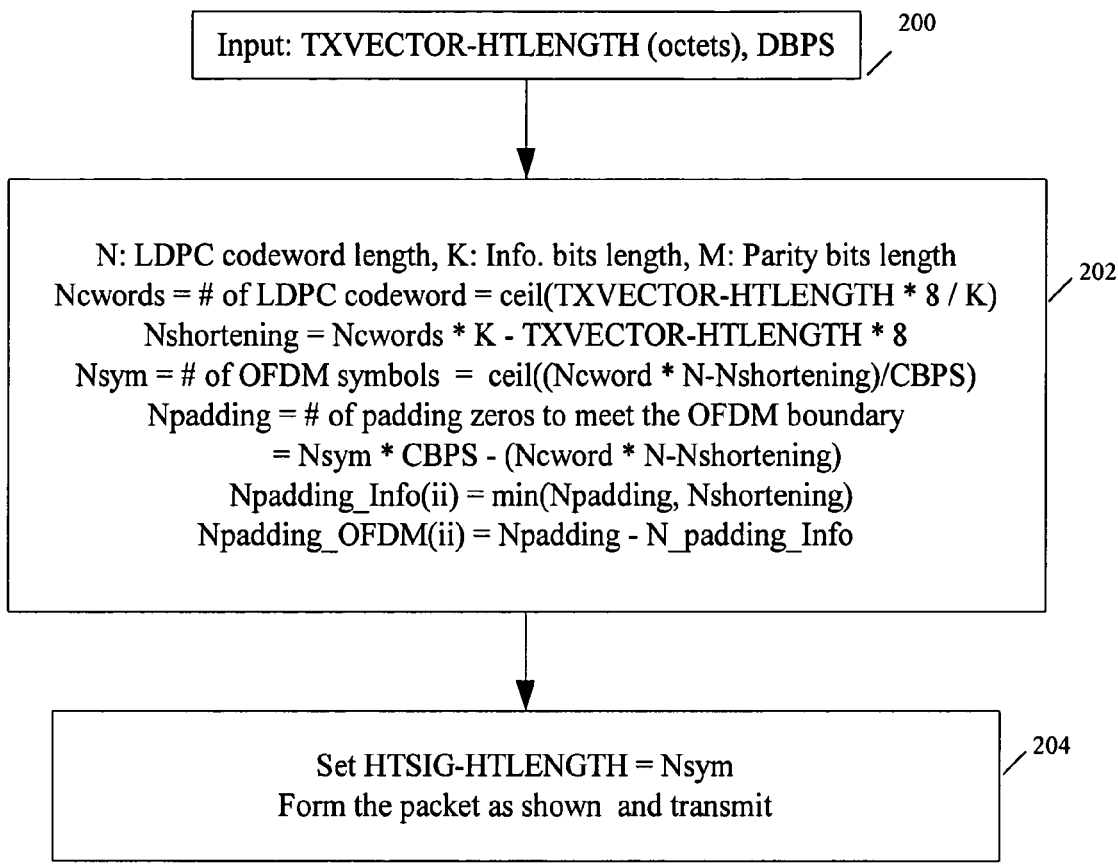
FIG. 2 shows a flowchart of an embodiment of the steps of LDPC encoding concatenation rule in the transmitter of the system of FIG. 1.

FIG. 2 shows an example flowchart of the steps of the process for high rate transmission in the concatenation rule. In steps below, N is the longest LDPC codeword length, K is the corresponding information bits length, and M is the corresponding parity bits length, where N=K+M.

Step 200:
Input: TXVECTOR-HTLENGTH (octets), DBPS. Initialize the concatenation process.

Step 202:
(A) Ncwords=# of LDPC codeword=ceil(TXVECTOR-HTLENGTH*8/K): Always use the largest codeword which essentially guarantees the best code performance since LDPC coding gain increases with increased code size. Also because we always use the largest codeword, the receiver algorithm is simplified.
(B) Nshortening=Ncwords*K-TXVECTOR-HTLENGTH*8.: Determine the required shortening bits to meet the codeword boundary. Because the LDPC code is a block code, it requires integer of K to encode each codeword. When the number of information bits (TXVECTOR-HTLENGTH*8) is not an integer of K, we need to pad additional Nshortening bits for encoding.
(C) Nsym=# of OFDM symbols=ceil((Ncword*N-Nshortening)/CBPS): Determine the number of OFDM symbols (Nsym) to be transmitted assuming the shortening bits are not transmitted. Use ceiling (ceil) operation to get integer number of OFDM symbols.
(D) Npadding=# of padding zeros to meet the OFDM boundary=Nsym*CBPS-(Ncword*N-Nshortening): Determine the required padding bits to meet the OFDM boundary based on the number of transmitted OFDM symbols. This padding bits are required because of the ceil( ) operation used to calculate Nsym.
(E) Npadding_Info=min(Npadding, Nshortening): Determine the exact padding bits to the information bits. Those Npadding_Info bits are scrambled and encoded and transmitted. The Npadding_Info bits are the minimum of the Npadding and Nshortening to ensure the efficiency.
(F) Npadding_OFDM(ii)=Npadding-N_padding_Info: Determine the exact additional padding bits required to meet the OFDM boundary. Those padding bits are not encoded but transmitted.

Step 204:
Set HTSIG-HTLENGTH=Nsym: Form the packet based on the parameters calculated above, then encode and transmit.

Figure 3:
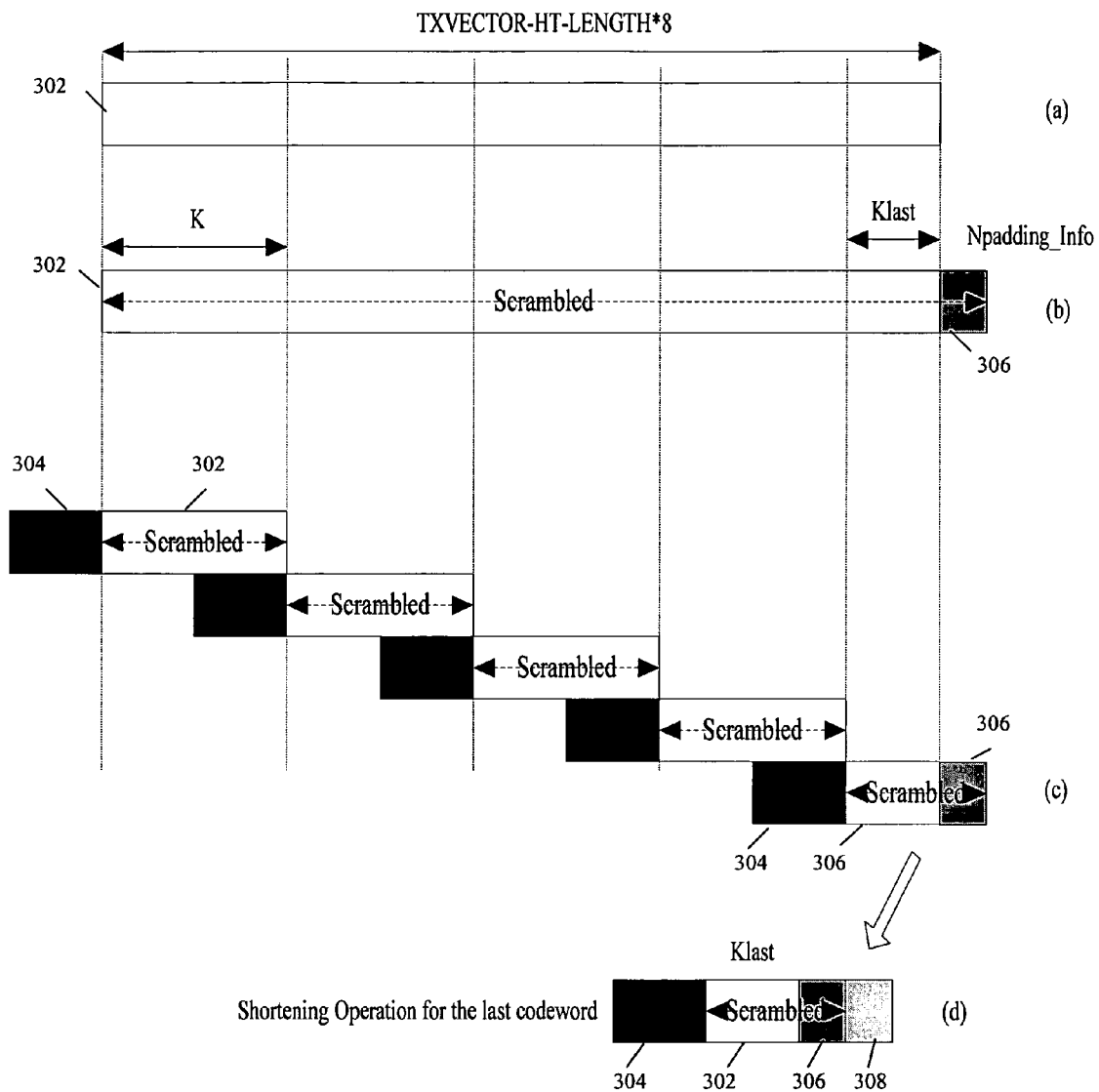
FIG. 3 shows a graphical illustration of an example encoding process with shortening only, in the system of FIG. 1.

FIG. 3 shows a diagrammatic example of the operation of an LDPC encoding procedure 300 according to the flowchart in FIG. 2. In FIG. 3, the blocks 302 represent the information bits. The blocks 304 represent the parity bits. The blocks 306 represent the padded bits for OFDM boundary and transmitted. The blocks 308 represent the shortened bits (not transmitted). LDPC codewords are transmitted in the following order: [Parity bits; Info bits] except the last codeword where shortening is applied.

Step (a) in FIG. 3 shows a block 302 of information bits. In step (b) of FIG. 3 the information bits are padded with Npadding_Info number of zeros by the shortening unit 102 (FIG. 1), and then scrambled by the scrambler 104 (FIG. 1). Step (c) of FIG. 3 shows how the padded information bits are cropped to different blocks and encoded by the LDPC encoder 106 (FIG. 1). Step (d) of FIG. 3 shows how the last codeword is processed, wherein additional zeros 308 are inserted to meet the code block boundary. The additional zeros are called shortening bits and are not transmitted.

Figure 4:
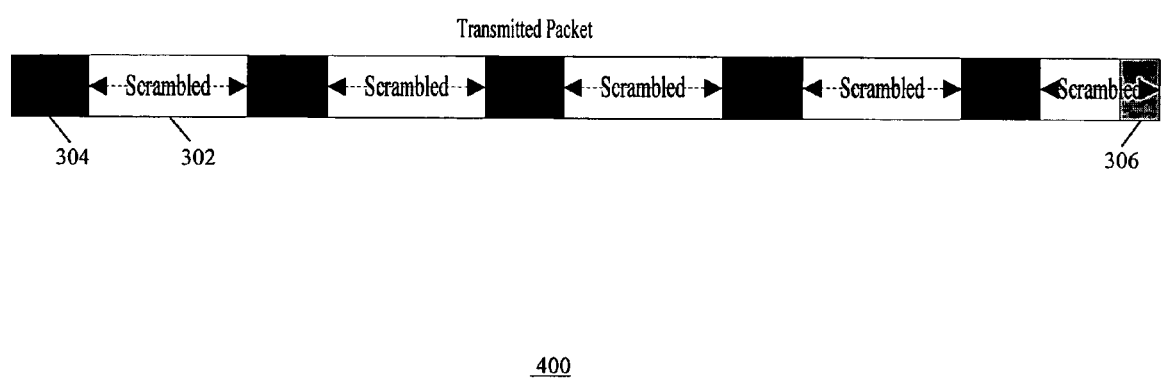
FIG. 4 shows an example transmitted packet.

If Nshortening>Npadding (i.e., Npadding_Info= Npadding), then the transmitted packet is as shown by the example packet 400 in FIG. 4. In this description, Nshortening represents the required shortening bits to meet the codeword boundary, and Npadding represents the required padding bits to meet the OFDM boundary based on the number of transmitted OFDM symbols. Both Nshortening and Npadding are calculated in Step 202 above.

Figure 5:
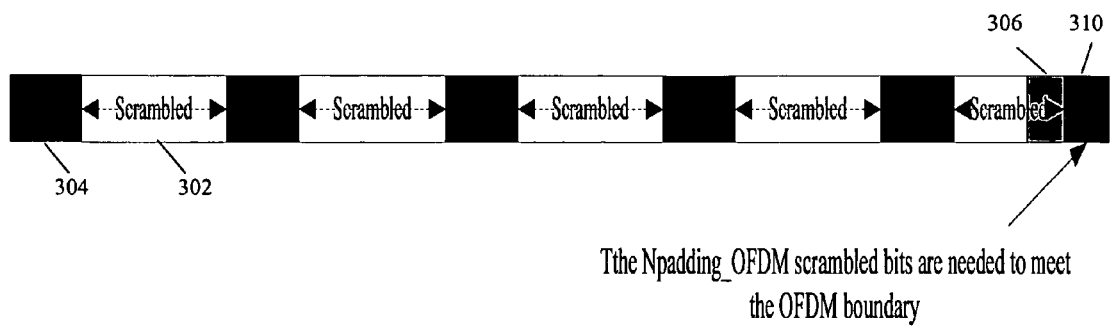
FIG. 5 shows another example transmitted packet.

If Nshortening<Npadding (i.e., Npadding_Info= Nshortening), then additional scrambled zeros 310 are inserted to meet the OFDM boundary, wherein the transmitted packet is as shown by the example packet 500 in FIG. 5. Note that Npadding_Info is distinguished from Npadding_OFDM, wherein Npadding_info are zeros which are encoded, while Npadding_OFDM are scrambled zeros to meet the OFDM boundary which are not encoded.

Figure 6:
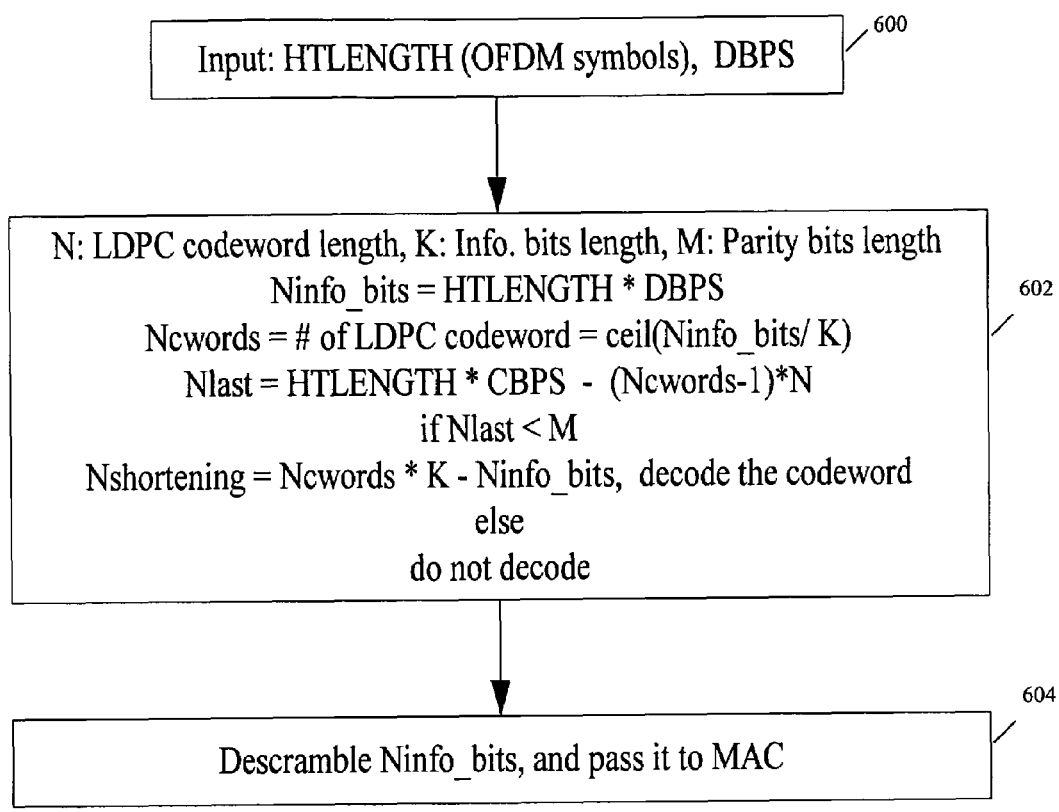
FIG. 6 shows a flow chart of an embodiment of the steps of LDPC encoding concatenation rule in the receiver of the system of FIG. 1.

An example process of receiver side (TX) concatenation rule with aggregation for high data rate transmission according to the present invention is described below. The process input and output values include:

Input:
  Number of coded bits per OFDM symbol: $N_{CBPS}=N_{BPSC}*N_{SD}*N_{SS}$ Number of information bits per OFDM symbol:
$N_{DBPS}=N_{CBPS}*R$ Number of transmitted OFDM symbols: $N_{OFDM}$ = HTLENGTH Output:
$N_{OFDM}*DBPS$ information bits FIG. 6 shows an example flowchart of the steps of the process for the concatenation rule for high rate transmission at the receiver. In steps below, N is the LDPC codeword length, K is the information bits length, and M parity bits length.

Step 600:
Input: HTLENGTH (OFDM symbols), DBPS: Initialize the concatenation rule at the receiver.

Step 602:
(A) Ninfo_bits=HTLENGTH*DBPS: Calculate the number of information bits within the packet Ninfo_bits using the HTLENGTH field in HT-SIG.

(B) Ncwords=# of LDPC codeword=ceil(Ninfo_bits/K: Determine the number of LDPC codewords (Ncwords) transmitted within this packet. The concatenation rule specifies the longest codeword will be used for high data rate transmission, K is known.

(C) Nlast=HTLENGTH*CBPS−(Ncwords−1)*N: Compute the length of the last codeword Nlast which is equal to the total number of transmitted bits (HTLENGTH*CBPS) minus the first Ncwords-1 length N codewords (Ncwords-1)*N (D) if Nlast<M
Nshortening=Ncwords*K−Ninfo_bits,
decode the codeword:
If the number of bits in the last codeword is larger than M, consider it as a shortened codeword which needs to be decoded. Calculate the number of shortening bits (Nshortening) to meet the integer number of codewords, insert Nshortening zeros with the last codeword and decode it.

(E) else
do not decode:
If the available bits in the last codeword is less than M, which means it is not a valid codeword since we only apply shortening in this scheme, do not decode them.

Step 604:
Descramble Ninfo_bits, and pass it to MAC. The decoded information bits need to be descrambled to get the original information bits. Then the data bits are passed to the upper layer for further process.

Figure 7:
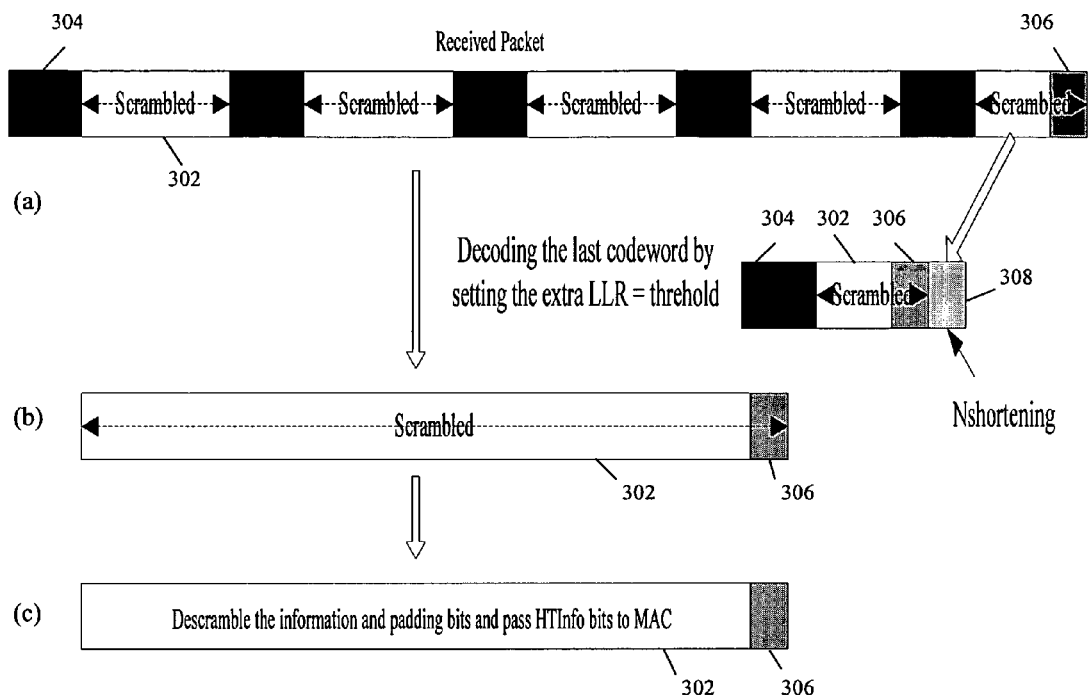
FIG. 7 shows a graphical illustration of an example decoding process in the system of FIG. 1.

FIG. 7 shows a diagrammatic example of the operation of an LDPC decoding procedure 700 according to an embodiment of the present invention where Npadding_OFDM=0. The receiver RX (FIG. 1) crops the received packet to N-bits codeword. Step (a) in FIG. 7 shows an example received packet which is decoded by the LDPC decoder 124 (FIG. 1). For the last codeword, if the number of bits is greater than parity bits length (M), then padding zeros 308 are added to the N bits, and the result is then decoded to the packet as shown in step (b) of FIG. 7. Otherwise, the padding zeros 308 are added to the end of the N information bits without decoding. In FIG. 7, LLR represents Log-Likelihood Ratio which is the soft bit metric used in the LDPC decoder, "threshold" represents a large number depending on the number of bits used in implementation, Nshortening represents the number of shortening bits to meet the integer number of codewords as calculated above, HTInfo represents the high-throughput information bits (i.e., packet payload) and MAC is Medium Access Control. The decoded packet is then descrambled by the descrambler 126 (FIG. 1) to generate the descrambled packet as shown in step (c) of FIG. 7.

Figure 8:
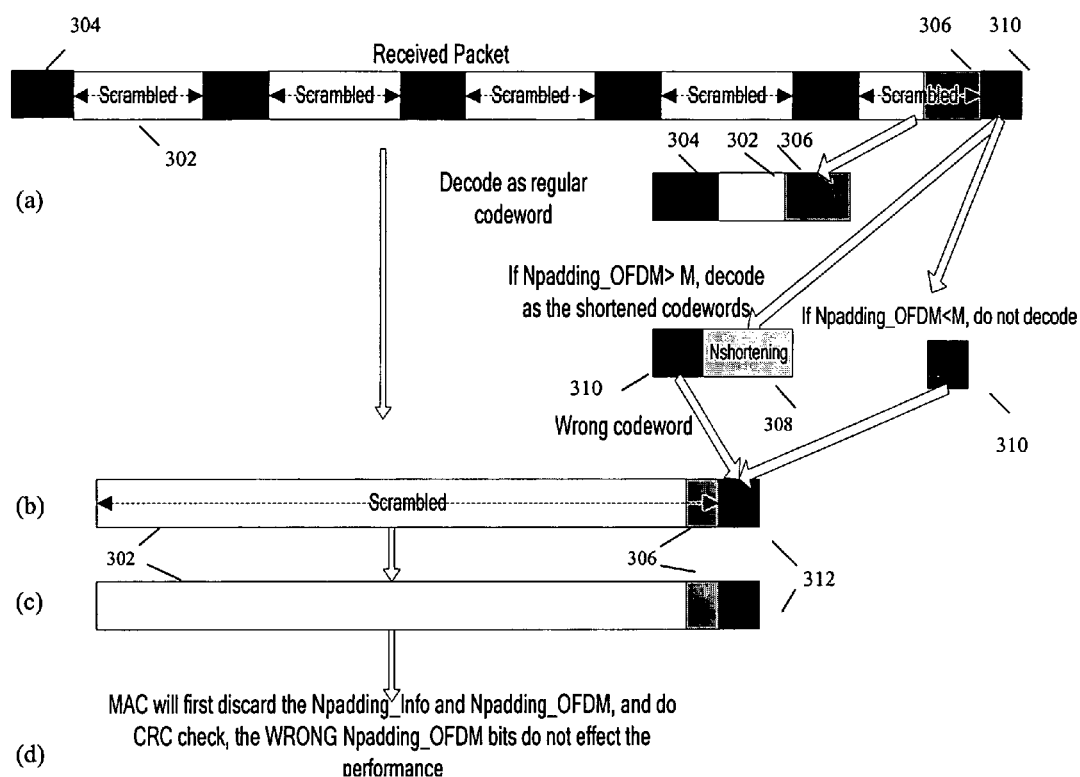
FIG. 8 shows a graphical illustration of another example decoding process in the system of FIG. 1.

There are two cases as shown in FIGS. 7 and 8. If Nshortening>Npadding, then the received packet is decoded as shown in FIG. 7. Otherwise, if Nshortening<Npadding, i.e., Npadding_OFDM>0, the received packet is decoded as shown the diagrammatic example of the operation of an LDPC decoding procedure 800 according to an embodiment of the present invention. The receiver RX (FIG. 1) crops the received packet to N-bits codeword. Step (a) in FIG. 8 shows an example received packet which is decoded by the LDPC decoder 124 (FIG. 1). The first (Ncwords-2) codewords are regular LDPC codewords including information bits 302 and parity check bits 304. The second last codeword includes the parity check bits plus the information bits and Npadding_info bits. It can also be decoded correctly using the LDPC decoder 124. For the last codeword 310, if the number of bits is greater than parity bits length (M), then padding zeros 308 are added to the N bits, and the result is then decoded, the decoder output 312 is add to the packet as shown in step (b) of FIG. 8. Otherwise, the padding zeros 310 are added to the end of the information bits without decoding, as 312. In step (c) of FIG. 8, the decoded sequence is descrambled by the descrambler to obtain the original sequence. The descrambled sequences then pass to the upper MAC layer for further process as shown in step (d) of FIG. 8.

In FIG. 7, wherein Nshortening>Npadding, the correct decoded information is directly obtained. In FIG. 8, where Nshortening<Npadding, incorrect decoded information for the last codeword 312 may be generated, however, the incorrect decoded information bits are removed at MAC level before the CRC check. As such, the correct packet information is indirectly obtained. FIGS. 7 and 8 are examples for illustration and analysis. As those skilled in the art will recognize, other examples according to the present invention are possible. The decoder 124 will simply pad zeros to the last codeword if more than M bits are left, and does not care whether it will get the correct codeword or not.

Figure 9:
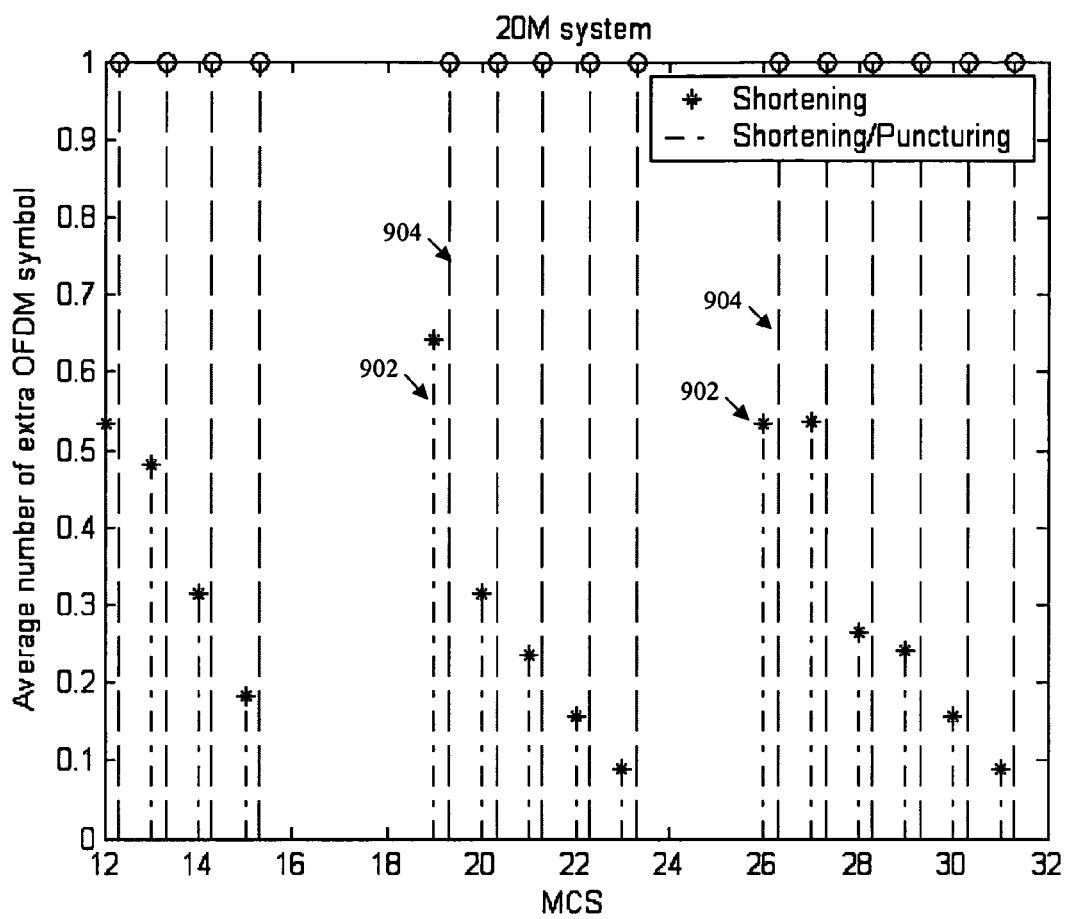
FIG. 9 shows efficiency comparison for a 20 MHz system according to the present invention and existing systems.
Figure 10:
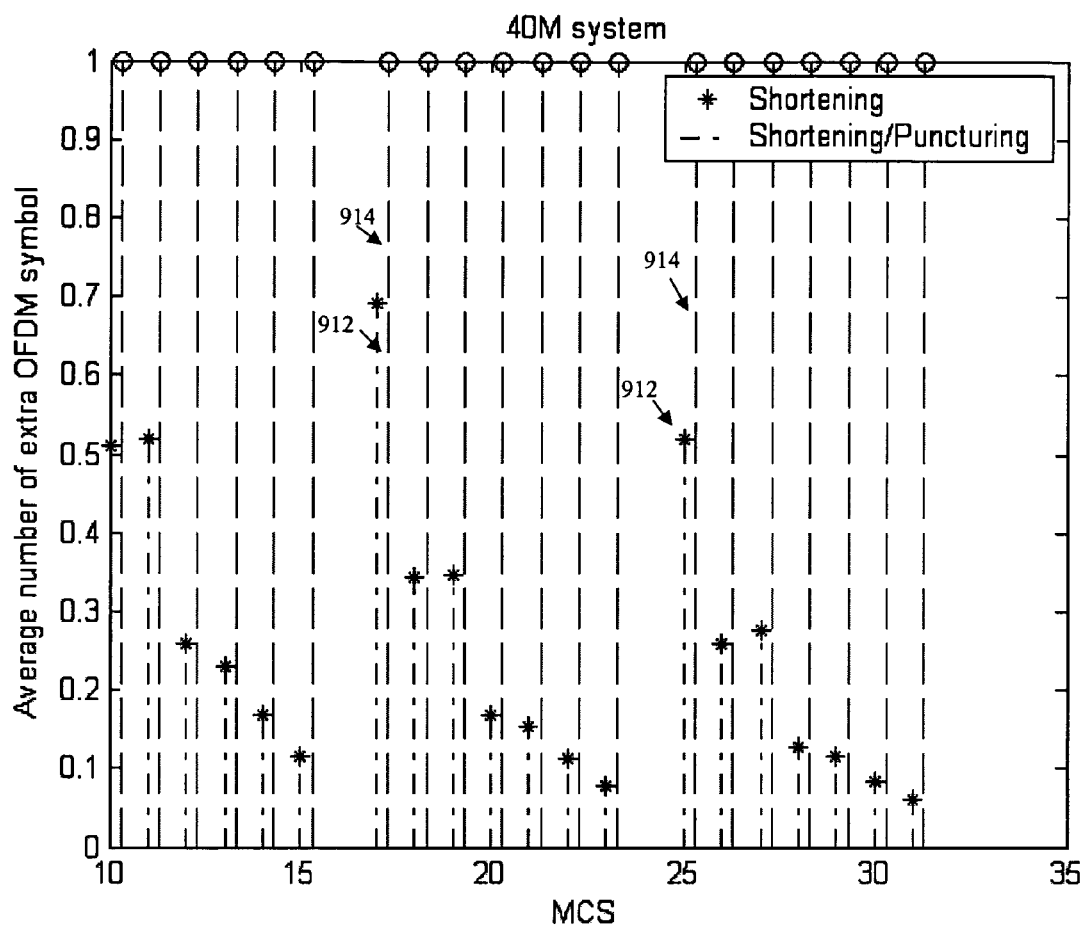
FIG. 10 shows efficiency comparison for a 40 MHz system according to the present invention and existing systems.

Referring to the examples in FIGS. 9-10, efficiency of an example WLAN system according to the present invention is evaluated in terms of the averaged extra OFDM symbols required to be transmitted per packet, averaged over TXVECTOR-HT-LENGTH from 250B-5000B. Using a shortening only scheme according to the present invention, a maximum of one OFDM symbol padding is needed, and no additional symbol is needed in many cases. Using a shortening/puncturing scheme according to the TGn Sync specification, the minimum OFDM symbol padding will be 1.

FIG. 9 illustrates efficiency comparison for a 20 MHz system according to the present invention, showing Modulation Coding Scheme (MCS) vs. average number of extra OFDM symbols for a system using shortening only 902 according to the present invention, and system that uses shortening/puncturing 904 as depicted by the legend in FIG. 9

FIG. 10 illustrates efficiency comparison for a 40 MHz system according to the present invention, showing Modulation Coding Scheme (MCS) vs. average number of extra OFDM symbols for a system using shortening only 912 according to the present invention, and system that uses shortening/puncturing 914 as depicted by the legend in FIG. 10.

Accordingly, the present invention provides shortening-only LDPC coding scheme for higher data rates, instead of shortening and puncturing in other schemes. As such, the present invention provides a more efficient LDPC coding scheme as no additional OFDM symbol padding is needed in many cases for higher transmission rates. The present invention also provided improved coding gain due to the shortening-only scheme, compared with shortening/puncturing approaches.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method comprising:
performing concatenation for Low Density Parity Check (LDPC) encoding in an Orthogonal Frequency Division Multiplexing (OFDM) wireless system where a packet length is specified in OFDM symbols for transmission to a receiver, said concatenation comprising:
determining a sequence of codewords based on a data packet payload size and transmission data rate, wherein the payload size is a number of transmitted information bits in OFDM symbols;
for transmission rates less than a predetermined rate applying shortening and puncturing across all codewords within the packet to minimize OFDM symbol padding; and
for transmission rates greater than the predetermined rate applying only shortening across all codewords within the packet to minimize OFDM symbol padding.

2. The method of claim 1 wherein the determining the sequence of codewords further includes selecting LDPC block size as an integer number of OFDM tones.

3. The method of claim 1 wherein the determining the sequence of codewords further includes determining the code length based on the number of transmitted information bits in OFDM symbols and the transmission data rate.

4. The method of claim 1 wherein the determining the sequence of codewords for transmission rates less than the predetermined rate further includes selecting a codeword of the largest possible code size according to the payload size, wherein selecting the largest possible code size essentially guarantees the best code performance as LDPC coding gain increases with increased code size.

5. The method of claim 1, wherein for transmission rates less than the predetermined rate the applying shortening and puncturing further includes:
determining criterion for applying shortening and puncturing, and
determining a process to compute a shortening-to-puncturing ratio.

6. The method of claim 1, for transmission rates less than the predetermined rate wherein the applying shortening and puncturing further includes adding one extra OFDM symbol to meet said criterion.

7. The method of claim 6 wherein the applying shortening and puncturing further includes:
determining the exact number of bits to be shortened and to be punctured, and
computing the total shortening and puncturing bits.

8. The method of claim 7 wherein the applying shortening and puncturing further includes calculating the shortening and puncturing bits per codeword.

9. The method of claim 1 wherein the determining the codewords for transmission rates greater than the predetermined rate further includes always selecting the largest codeword regardless of the payload size, wherein selecting the largest code size essentially guarantees the best code performance as LDPC coding gain increases with increased code size.

10. The method of claim 1 wherein for transmission rates greater than the predetermined rate the applying shortening further includes determining criterion for applying shortening.

11. The method of claim 1 further comprising encoding data packets with the selected codewords, and transmitting the encoded packets to a receiver.

12. The method of claim 11 further comprising decoding the received packets in the receiver to obtain the data packets.

13. The method of claim 1 wherein for 52 data tones, when number of information bits per OFDM symbol ($N_{dbps}$) is less than 234 corresponding to 58.5 Mbps transmission rate, it is considered as low transmission rate, and when $N_{dbps}$ is greater than 234, it is considered as high transmission rate.

14. The method of 13 further includes determining when to add one extra OFDM symbols.

15. The method of claim 1 wherein the predetermined rate is a 58.5 Mbps transmission rate.

16. A method comprising:
performing concatenation for Low Density Parity Check (LDPC) encoding in an Orthogonal Frequency Division Multiplexing (OFDM) wireless system where a packet length is specified in OFDM symbols for transmission to a receiver, said concatenation comprising:
determining a sequence of codewords based on a data packet payload size and transmission data rate, wherein the payload size is a number of transmitted information bits in OFDM symbols;
for transmission rates less than a predetermined rate applying shortening and puncturing across all codewords within the packet to minimize OFDM symbol padding; and
for transmission rates greater than the predetermined rate applying only shortening across all codewords within the packet to minimize OFDM symbol padding, and determining padding bits and then scrambling, encoding and transmitting the padding bits along with information bits.

17. The method of claim 16 further including: for transmission rates greater than the predetermined rate, determining the shortening bits which are encoded without being transmitted.

18. The method of claim 16 further including for transmission rates greater than the predetermined rate, determining the padding bits to meet OFDM boundary which are scrambled and transmitted without being encoded.

19. The method of claim 16 further including for transmission rates greater than the predetermined rate, performing shortening.

20. The method of claim 19 further including for transmission rates greater than the predetermined rate, performing shortening on only the last LDPC codeword.

21. The method of claim 20 wherein shortening on last LDPC codeword bits is evenly distributed across all codeword for even performance.

22. The method of claim 16 further comprising encoding data packets with the selected codewords, and transmitting the encoded packets to a receiver.

23. The method of claim 22 further comprising decoding the received packets in the receiver to obtain the data packets.

24. The method of claim 23, wherein the decoding the received packets further includes:
performing LDPC decoding by cropping a received packet to an N-bit codeword;
for the last codeword, if the number of bits is greater than parity bits length (M), then adding padding zeros to the N bits, and decoding the result, otherwise if the number of bits is not greater than parity bits length (M), then adding padding zeros to the end of the N bits without decoding.

* * * * *